(12) United States Patent
Lin et al.

(10) Patent No.: US 8,642,377 B2
(45) Date of Patent: Feb. 4, 2014

(54) METHOD OF PRODUCING CONDUCTIVE THIN FILM

(75) Inventors: Ching-Fuh Lin, Taipei (TW); Ming-Shiun Lin, Taipei (TW)

(73) Assignee: National Taiwan University, Taipei (TW)

(*) Notice: Subject to any disclaimer, the term of this patent is extended or adjusted under 35 U.S.C. 154(b) by 0 days.

(21) Appl. No.: 13/110,862

(22) Filed: May 18, 2011

(65) Prior Publication Data

US 2012/0220069 A1    Aug. 30, 2012

(30) Foreign Application Priority Data

Feb. 25, 2011    (TW) .............................. 100106318 A

(51) Int. Cl.
*H01L 21/00* (2006.01)
*H01L 21/3205* (2006.01)
*H01L 21/4763* (2006.01)
*H01L 21/44* (2006.01)

(52) U.S. Cl.
USPC ....... 438/98; 438/592; 438/652; 257/E21.593

(58) Field of Classification Search
USPC ......... 438/98, 608, 609, FOR. 341, 592–594, 438/614, 622–625, 652–656, 685, 686; 257/E21.593
See application file for complete search history.

(56) References Cited

U.S. PATENT DOCUMENTS

| | | | | |
|---|---|---|---|---|
| 4,940,495 | A | * | 7/1990 | Weber et al. .................. 136/256 |
| 5,601,869 | A | * | 2/1997 | Scott et al. .................. 427/126.3 |
| 2004/0248394 | A1 | * | 12/2004 | Kobayashi et al. ........... 438/609 |
| 2007/0126147 | A1 | * | 6/2007 | Fujikawa et al. ............. 264/299 |
| 2009/0293946 | A1 | * | 12/2009 | Lin et al. ....................... 136/255 |
| 2010/0258796 | A1 | * | 10/2010 | Horio et al. ..................... 257/43 |
| 2011/0155228 | A1 | * | 6/2011 | Tung et al. .................... 136/255 |
| 2011/0195239 | A1 | * | 8/2011 | Takane et al. ................. 428/206 |
| 2012/0164324 | A1 | * | 6/2012 | Clothier et al. ............... 427/226 |

FOREIGN PATENT DOCUMENTS

JP    2010205873 A  *  9/2010

* cited by examiner

*Primary Examiner* — Calvin Choi
(74) *Attorney, Agent, or Firm* — Stout, Uxa, Buyan & Mullins, LLP

(57) ABSTRACT

An embodiment of this invention provides a method to produce a conductive thin film, which comprises: providing a substrate; forming a first metal oxide layer on the substrate; forming an indium-free metal layer on the first metal oxide layer; and forming a second metal oxide layer on the indium-free layer, wherein the first metal oxide layer, the indium-free metal layer, and the second oxide layer are all solution processed.

12 Claims, 5 Drawing Sheets

Untreated by PDAC      Treated by PDAC

METHOD OF PRODUCING CONDUCTIVE THIN FILM

CROSS-REFERENCE TO RELATED APPLICATIONS

The entire contents of Taiwan Patent Application No. 100106318, filed on Feb. 25, 2011, from which this application claims priority, are incorporated herein by reference.

BACKGROUND OF THE INVENTION

1. Field of the Invention

The present invention relates to methods for forming conductive thin films.

2. Description of Related Art

One or more transparent conductive thin films (TCO) are typically needed in fabricating optoelectronics or electronics, such as solar cells, surface acoustic wave devices, piezoelectric devices, gas detectors, liquid crystal displays, and so on.

To date, most transparent conductive thin films are made of tin indium oxide (ITO). Indium is a rare earth element with toxicity and is unstable in hydrogen plasma when producing ITO, resulting in high production cost.

In addition, prior art employs thermal evaporation and sputtering methods to produce transparent conductive thin films. These methods need costly apparatuses and cannot produce large area of transparent conductive thin film.

Accordingly, it would be advantageous to develop a novel method for fabricating transparent conductive thin films with large area, low toxicity, and low production cost.

SUMMARY OF THE INVENTION

An object of the present invention is to provide a novel method for fabricating transparent conductive thin films with large area, low toxicity, and low production cost.

Accordingly, an embodiment of this invention provides a method of producing a conductive thin film, which comprises the steps of: providing a substrate; forming a first metal oxide layer on the substrate; forming an indium-free metal layer on the first metal oxide layer by a non-solution process or a solution process; and forming a second metal oxide layer on the indium-free metal layer by the solution process.

In embodiments of this invention, the solution process comprises a sol-gel method, a micro/nano stacking method, a hydrothermal method, and a dip coating method.

Another embodiment of this invention omits the first metal oxide layer.

DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known components and process operations are not described in detail in order not to unnecessarily obscure the present invention. While drawings are illustrated in detail, it is appreciated that the quantity of the disclosed components may be greater or less than that disclosed, except when expressly restricting the amount of the components.

A first embodiment of this invention employs a high temperature process to fabricate a transparent or an opaque conductive thin film on a substrate. The conductive thin film has a composite structure consisting of metal/metal oxide or metal oxide/metal/metal oxide in which the metal oxide and even the metal layer are produced by one or more solution processes. The high temperature refers to that the processing temperature may be more than 500° C.

FIG. 1A to FIG. 1F show a method for forming conductive thin film according to the first embodiment of the present invention.

Figure 1A:
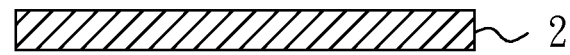
FIG. 1A to FIG. 1F show a method for forming a conductive thin film according to the first embodiment of the present invention.
Figure 1B:
Figure 1C:
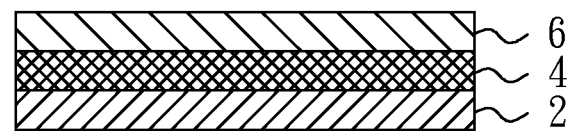

Referring to FIG. 1A, a substrate 2, such as a silicon substrate 2, is provided and cleaned. Referring to FIG. 1B, an insulating layer 4 is formed on the substrate 2. For example, a silicon dioxide layer is formed on the substrate by thermal process. Referring to FIG. 1C, a first metal oxide layer 6 with thickness between about 20 nm and about 50 nm is formed on the insulating layer 4 by a solution process. The solution process may comprise a sol-gel method, a micro/nano particle stacking method, a hydrothermal (synthesis) method, a dip coating method, and the like, preferably the sol-gel method. The first metal oxide layer 6 may comprise zinc oxide, titanium oxide, vanadium oxide, nickel oxide, molybdenum oxide, copper oxide, silver oxide, tungsten oxide, or other metal oxides. The first metal oxide layer 6 formed by the sol-gel method is described as follows. Firstly, a first metal oxide solution including reactants is coated on the insulating layer 4 by spin coating, dip coating, flow coating, and the like methods. After that, the coated first metal oxide solution is heated and dried and thus reaction is activated to form the first metal oxide layer 6. Oven or other heating apparatuses may be used for heating and activating the first metal oxide solution. In addition, the heating process may be performed under a vacuum chamber or atmosphere with air, nitrogen, other suitable gases, or the combination thereof.

Figure 1D:
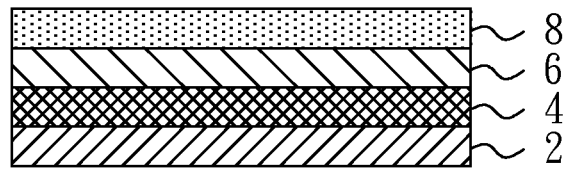

Referring to FIG. 1D, a metal layer 8 is then formed on the first metal oxide layer 6 by thermal evaporation, sputtering, or the foregoing solution process. The metal layer 8 may comprise gold, silver, platinum, copper, iron, manganese, cobalt, other non-indium metals, or combination of the foregoing materials. The solution process may be the sol-gel method, the micro/nano particle stacking method, the hydrothermal synthesis method, the dip coating method, and preferably the micro/nano particle stacking method. For example, a solution comprising micro/nano metal particles is coated on the first metal oxide layer 6 under room temperature or a low temperature, typically below 100° C. After that, the micro/nano metal particles are stacked to form the metal layer 8. The detail of the micro/nano particle stacking method is described in U.S. application Ser. No. 12/574,697, entitled "Suspension or Solution for Organic Optoelectronic Device, Making Method thereof, and Applications," the entire contents of which are incorporated herein by reference. If a transparent conductive thin film is needed, the thickness of the metal layer 8 may be controlled between about 2 nm and about 10 nm; moreover, the thickness is between about 2 nm and about 8 nm for the metal layer 8 being made of silver or copper. If an opaque conductive thin film is needed, the thickness of the metal layer 8 may be controlled more than 100 nm.

Figure 1E:
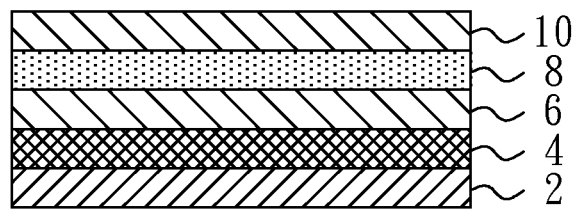

Referring to FIG. 1E, a second metal oxide layer 10 is then formed on the metal layer 8 by same method for forming the first metal oxide layer 6. Usually the first metal oxide layer 6 and the second metal oxide layer 10 are made of same material with same thickness, but is not limited to this; they can be different materials with different thicknesses.

Figure 1F:
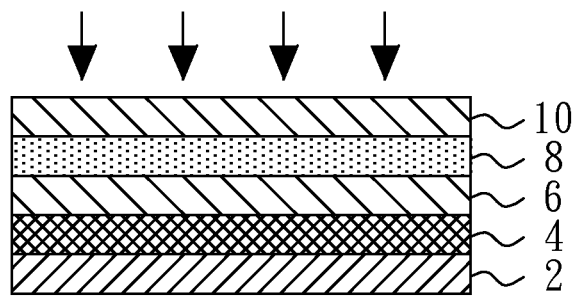

Referring to FIG. 1F, the structure as shown in FIG. 1E is then annealed at a temperature between about 100° C. and about 1400° C. for a period of time. Equipments for annealing may comprise rapid thermal anneal (RTA) system, furnace, oven, laser annealing, and so on.

In the foregoing embodiment, substrate 2 may made of other materials such as quartz, metals, semiconductors, glass materials, and plastics, except silicon. In some embodiments of this invention, the step for forming the insulating layer 4 may be omitted when the substrate 2 is made of insulating materials such as quartz. In addition, the substrate 2 may be immersed into an acid solution to form the insulating layer 4. Moreover, if the thickness of the metal layer 8 is more than 100 nm, the annealing step may be omitted. Furthermore, in another embodiment of this invention, the first metal oxide layer 6 is omitted and the metal layer 8 is formed on the insulating layer 4 or substrate 2.

A second embodiment of this invention employs a low temperature process to fabricate a transparent or an opaque conductive thin film on a substrate. The conductive thin film has a composite structure consisting of metal/metal oxide or metal oxide/metal/metal oxide in which the metal oxide and even the metal layer are produced by one or more solution processes. The low temperature refers to that all the processing temperatures are less than 500° C. and even at room temperature, about 25° C.

Figure 2A:
FIG. 2A to FIG. 2F show a method for forming a conductive thin film according to the second embodiment of the present invention.
Figure 2B:
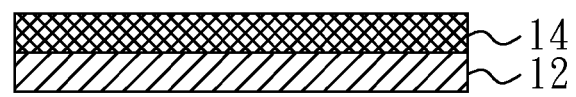
Figure 2C:
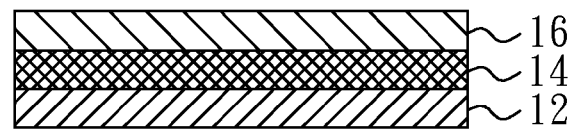
Figure 2D:
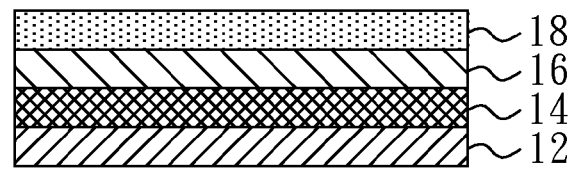

FIG. 2A to FIG. 2F show a method for forming conductive thin film according to the second embodiment of the present invention. Referring to FIG. 2A, a substrate 12 is provided and cleaned. Referring to FIG. 2B, an insulating layer 14 is formed on the substrate 12 by methods mentioned in the first embodiment. Referring to FIG. 2C, a first metal oxide layer 16 with thickness between about 20 nm and about 50 nm is formed on the insulating layer 14 by a solution process that is same and mentioned in the first embodiment. Referring to FIG. 2D, a metal layer 18 is formed on the first metal oxide layer 16 by a method that is same and mentioned in the first embodiment.

Figure 2E:
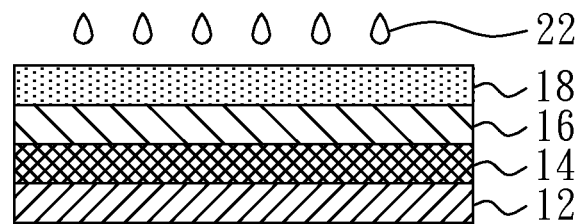
Figure 2F:
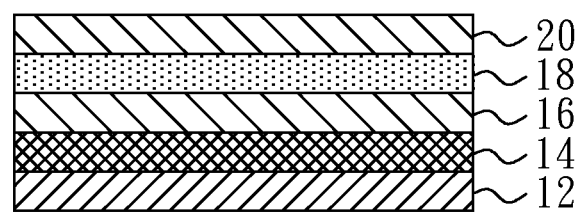

Referring to FIG. 2E, a polyelectrolyte solution 22, such as a polycation solution, e.g., poly(diallyldimethylammonium chloride), PDAC, is employed to contact the metal layer 18. Method for contacting the metal layer 18 may comprise, for example, dropping the polyelectrolyte solution 22 on the surface of the metal layer 18, or immersing the metal layer 18 in the polyelectrolyte solution 22. The polyelectrolyte solution 22 will shorten the distances between granules of the metal layer 18 and thus the flatness and conductivity of the metal layer 18 are improved. Then, the polyelectrolyte solution 22 is dried by natural or other methods known in the art. This step may be carried out under room temperature. Referring to FIG. 2F, a second metal oxide layer 20 is formed on the metal layer 18 by the same method for forming the first metal oxide layer 16. After that, the annealing step may be omitted and a conductive thin film is finished. Modifications for the second embodiment are same as the first embodiment; therefore the description is omitted.

EXAMPLE 1

This example employs the high temperature process to fabricate a transparent conductive thin film having structure ZnO/Ag/ZnO on a silicon substrate.

First, a furnace is used to heat the silicon substrate at 1000° C. for 3 hours and thus an oxide layer (as an insulating layer) with thickness 200 nm is formed on the surface of the silicon substrate.

Then, a piece of silicon substrate with dimension about 1 cm×1 cm is cut and cleaned by a standard process: in order, immerse the cut silicon substrate in acetone, methanol, and deionized water, and shake it by ultrasonic waves for 15 minutes; then, dry the silicon substrate by nitrogen gun.

Then, a dopant-free ZnO sol-gel solution is prepared. A solute $Zn(CH3COOH)_2.2H2O$ and a solvent 2-Methoxyethanol (2MOE) are mixed with molar ration 1:1 as well as monoethanolamine (MEA) added as stable agent. All reagents are placed into a vessel then sealed. The vessel is then heated to 65° C. and agitated for about 2 hours until the mixture becomes limpid, a 0.5 M ZnO sol-gel solution being prepared.

A spin coater is then used to coat the ZnO sol-gel solution on the cut silicon substrate. The spinning speed and duration will determine the thickness of the ZnO film. Methanol is firstly spin coated on the silicon substrate using two conditions 1000 rpm, 10 sec duration; and 4000 rpm, 30 sec duration in sequence, and dried by nitrogen gun for forming hydroxyl groups on the surface of the silicon substrate. The ZnO sol-gel solution is then spin coated on the silicon substrate using two conditions 1000 rpm, 10 sec duration; and 4000 rpm, 30 sec duration in sequence. The hydroxyl groups help silicon to adsorb the ZnO sol-gel solution and the number of coating determines the thickness of the coating layer.

The ZnO sol-gel coating layer is then dried to form a rough ZnO layer. A hot plate heats the rough ZnO layer at 200° C. for 30 min to remove organics and form a first ZnO layer with thickness between about 30 nm and 50 nm. Repeating the foregoing steps can increase the thickness.

A silver layer with thickness between 2 and 10 nm is then formed on the first ZnO layer by thermal evaporation. A second ZnO layer is then formed on the silver layer by the method same for forming the first ZnO layer. Finally, a furnace anneals the prepared sample at temperature between about 400° C. to about 700° C. for 1 hr, and a ZnO/Ag/ZnO conductive thin film is prepared.

EXAMPLE 2

This example employs the same process as example 1 to fabricate a ZnO/Ag/ZnO structure on a silicon substrate, except the thickness of silver layer is more than 100 nm, resulting in an opaque conductive thin film.

EXAMPLE 3

This example employs the same process as example 1 to fabricate an Ag/ZnO structure on a silicon substrate, except the first ZnO layer is omitted, i.e.: the silver layer is formed on the insulating layer, and the second ZnO layer is formed on the silver layer.

EXAMPLE 4

This example employs the same process as example 3 to fabricate an Ag/ZnO structure on a silicon substrate, except the thickness of silver layer is more than 100 nm, resulting in an opaque conductive thin film.

EXAMPLE 5

This example employs the low temperature process to fabricate a transparent conductive thin film having structure ZnO/Ag/ZnO on a glass substrate, in which the first ZnO layer and the second ZnO layer are formed by same method as example 1, but the silver layer is formed by the micro/nano particle stacking method instead of the thermal evaporation. A 0.1 mg/ml of micro/nano silver particle solution is coated on the first ZnO layer; under the room temperature, the micro/nano silver particles of the solution are stacked to form the silver layer on the first ZnO layer. The thickness of the silver layer is controlled between about 2 mu and 8 nm or between about 2 nm and 10 nm.

Figure 3:
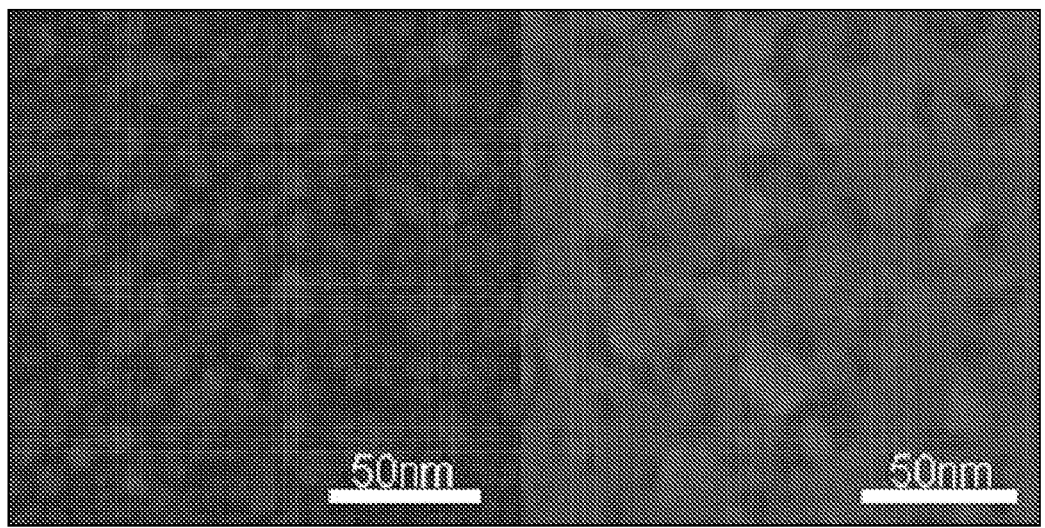
FIG. 3 is a scanning electron microscope (SEM) image illustrating the untreated and treated silver layer by PDAC.

Under room temperature, PDAC solution is then dropped on the surface of the silver layer and naturally dried. FIG. 3 is a scanning electron microscope (SEM) image illustrating the untreated and treated silver layer by PDAC. The treated silver surface looks like to be sintered. The PDAC solution can bind the silver granules and shorten distance between granules, and thus improve the flatness and conductivity of the silver layer.

After that, the second ZnO layer is formed on the silver layer and an annealing step is unnecessary.

EXAMPLE 6

This example employs the same process as example 5 to fabricate a ZnO/Ag/ZnO structure on a glass substrate, except the thickness of silver layer is more than 100 nm, resulting in an opaque conductive thin film.

EXAMPLE 7

This example employs the same process as example 5 to fabricate an Ag/ZnO structure on a silicon substrate, except the first ZnO layer is omitted, i.e.: the silver layer is formed on the glass substrate instead of the first ZnO layer, and the second ZnO layer is formed on the silver layer.

EXAMPLE 8

This example employs the same process as example 7 to fabricate an Ag/ZnO structure on a glass substrate, except the thickness of silver layer is more than 100 nm, resulting in an opaque conductive thin film.

EXAMPLE 9

This example employs the same process as example 5 to fabricate a transparent conductive thin film having structure ZnO/Ag/ZnO on a glass substrate, except that the first ZnO layer and the second ZnO layer are formed by a hydrothermal method instead of the sol-gel method. A ZnO seed layer is firstly coated on the surface prepared to form the first ZnO layer or the second ZnO layer, i.e., the surface of the glass substrate or the metal layer. After that, an aqueous solution containing the reactants zinc nitrate hexahydrate [$Zn(NO_3)_2 \cdot 6H_2O$] and methenamine ($C_6H_{12}N_4$), is placed in an autoclave with controlled suitable pressure and temperature (may below 100° C.), to grow the first ZnO layer or the second ZnO layer.

The conductive thin films provided by embodiments of this invention can be applied to various optoelectronics or electronics. For example, the prepared transparent conductive thin films can be used as an electrode of a solar cell to increase its transmittance and power conversion efficiency. For example, the prepared opaque conductive thin films, when the thickness of the metal layer is between 100 nm and 200 nm, can be used as a reflecting layer, i.e., an n-electrode, of a light-emitting diode to increase its light output. Conventional light-emitting diodes typically use gold or indium tin oxide layer as the n-electrode in which gold will absorb light, causing poor light efficiency, and indium tin oxide has unsatisfied conductivity, causing bad light uniformity. Instead, when a prepared conductive thin film of this invention such as ZnO/Ag/ZnO is used as the n-electrode of a light-emitting diode, silver provides better conductivity than indium tin oxide and will not absorb light, and zinc oxide can protect the silver layer to avoid oxidation and increase reliability.

Prior art also fabricate composite conductive thin films by conventional thermal evaporation or sputtering, which need costly apparatuses and cannot produce large area of conductive thin film. In addition, although the sol-gel method is well known, it had not been used to fabricate a composite conductive thin film as disclosed by this invention. There must be some difficulty in producing such films. The present invention successfully employs solution processes to fabricate transparent or opaque conductive films with a metal oxide/metal/metal oxide or a metal/metal oxide composite structure. The processes are cheap and speedy. The produced conductive thin films have excellent conductivities that can be applied for various optoelectronics. The present invention provides solutions overcoming problems existed for a long time and benefiting the art in the future.

Although specific embodiments have been illustrated and described, it will be appreciated by those skilled in the art that various modifications may be made without departing from the scope of the present invention, which is intended to be limited solely by the appended claims.

What is claimed is:

1. A method of producing a conductive thin film for being used as an electrode, comprising the steps of:
   providing a substrate;
   forming a first metal oxide layer on the substrate by a solution process;
   forming a metal layer on and in contact with the first metal oxide layer by a non-solution process or the solution process; and
   forming a second metal oxide layer on and in contact with the metal layer by the solution process;
   wherein both the first metal oxide layer and the second metal oxide layer are semiconductor layers comprising zinc oxide, titanium oxide, vanadium oxide, nickel oxide, molybdenum oxide, copper oxide, silver oxide, or tungsten oxide with a formula $M_xO_y$, in which M denotes zinc, titanium, vanadium, nickel, molybdenum, copper, silver, or tungsten, O denotes oxide, and x and y denote positive integers; and
   wherein the solution process comprises a micro/nano particle stacking method comprising the steps of:
      coating a solution comprising a solvent and a plurality of micro/nano metal particles or a plurality of micro/nano metal oxide particles on a surface prepared to form the metal layer, the first metal oxide layer, or the second metal oxide layer; and
      stacking the plurality of micro/nano metal particles or the plurality of micro/nano metal oxide particles to form the metal layer, the first metal oxide layer, or the second metal oxide layer in a physical manner after the solvent is removed;

wherein all the steps of the micro/nano particle stacking method are performed at a temperature less than 100° C. during and after the formation of the metal layer, the first metal oxide layer, or the second metal oxide layer.

2. The method as recited in claim 1, wherein the non-solution process comprises a thermal evaporation or a sputtering.

3. The method as recited in claim 1, further comprising forming an insulating layer between the substrate and the first metal oxide layer.

4. The method as recited in claim 1, wherein the substrate comprises quartz, metals, semiconductors, glass materials, or plastics.

5. The method as recited in claim 1, wherein after forming the metal layer, further comprises contacting the metal layer with a polyelectrolyte solution to improve the flatness and conductivity of the metal layer.

6. The method as recited in claim 5, wherein the polyelectrolyte solution comprises poly(diallyldimethylammonium chloride).

7. The method as recited in claim 1, wherein the metal layer comprises gold, silver, platinum, copper, iron, manganese, cobalt, other non-indium metals, or combination thereof.

8. The method as recited in claim 1, wherein after forming the second metal oxide layer on the metal layer, further comprising an annealing step.

9. The method as recited in claim 1, wherein the thickness of the metal layer is between about 2 nm and 10 nm.

10. The method as recited in claim 9, wherein the metal layer comprises silver or copper, and the thickness of the metal layer is between 2 nm and 8 nm.

11. The method as recited in claim 1, wherein the thickness of the metal layer is between about 100 nm and 200 nm, and the conductive thin film is used as a reflecting layer.

12. The method as recited in claim 1, wherein the conductive thin film is used as an electrode of a solar cell.

* * * * *